COMPRESSION BONDED SEMICONDUCTOR DEVICE WITH HERMETICALLY SEALED SUBASSEMBLY
Filed Feb. 15, 1966
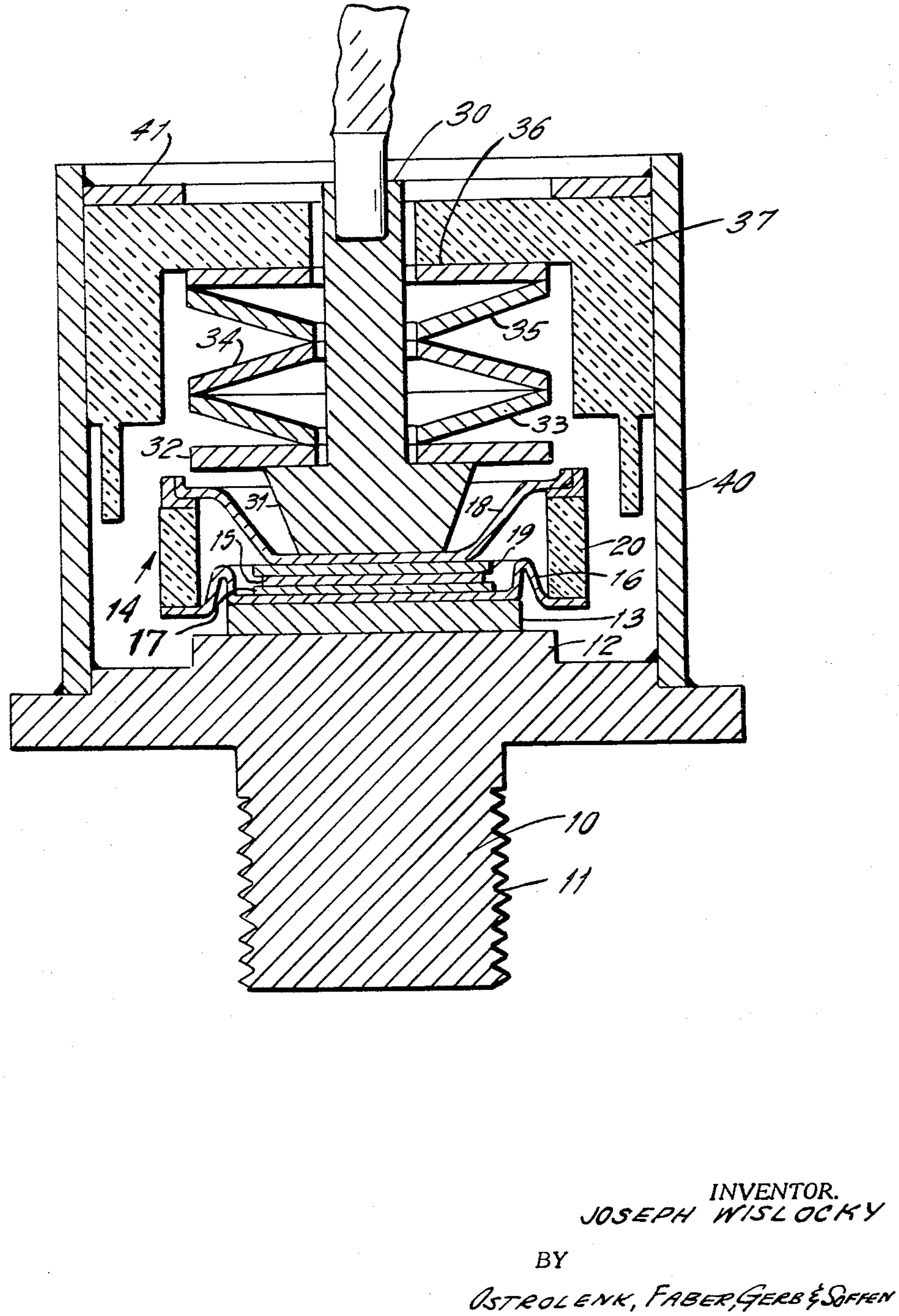
INVENTOR.
JOSEPH WISLOCKY
BY
OSTROLENK, FABER, GERB & SOFFEN
ATTORNEYS United States Patent Office 3,396,316

Patented Aug. 6, 1968

3,396,316

COMPRESSION BONDED SEMICONDUCTOR DEVICE WITH HERMETICALLY SEALED SUBASSEMBLY

Joseph Wislocky, El Segundo, Calif., assignor to International Rectifier Corporation, El Segundo, Calif., a corporation of California Filed Feb. 15, 1966, Ser. No. 527,610
3 Claims. (Cl. 317—234)

ABSTRACT OF THE DISCLOSURE

The invention provides a semiconductor disposed between two insulated contact plates in an hermetically sealed subassembly. A housing, including a support base, encloses the subassembly with spring means for maintaining the subassembly and a connecting stud in electrically operative position.

This invention relates to a novel construction for semiconductor devices, and more specifically relates to a novel housing construction for a semiconductor device of the pressure bonded type which uses a washer arrangement for the provision of the compression bonding force.

Semiconductor device assemblies using compression forces for obtaining the connection between the semiconductor wafer and the conductive electrodes adjacent thereto are well known in the art. Copending application Ser. No. 361,400 filed Apr. 21, 1964, now Patent No. 3,293,508 and assigned to the assignee of the present application, describes one type of subassembly of a semiconductor wafer within a pair of flexible saucer-shaped electrodes whose rims are mechanically connected and insulated by an insulation cylinder which subassembly can now be assembled in diverse types of housings.

In accordance with the present invention, this type of subassembly is arranged in a housing with spring washer means being provided to obtain the compressional force to hold the subassemblage in place and to provide the pressures required for good electrical connection between the semiconductor wafer and the conductive surfaces adjacent thereto.

Accordingly, a primary object of this invention is to provide a novel inexpensive housing for a compression bonded semiconductor device.

Another object of this invention is to provide a novel semiconductor assemblage, using compression bonding concepts, which is simple to manufacture.

These and other objects of the invention will become apparent from the drawing which shows a cross-sectional view of a semiconductor housing incorporating a compression bonded wafer in accordance with the invention. In the drawing, all parts shown in cross-section are circular in configuration with the cross-section taken through the axis of the circular components with the exception of part 10 which could have a hexagonal shape.

The device is comprised of a standard conductive mounting stud 10 which has a threaded base 11 and a pedestal 12. A conductive disk 13 is mounted on pedestal 12 and could be an integral part thereof, and receives the sub-assemblage 14 which hermetically seals a semiconductive wafer 15 having one or more junctions therein. The sub-assemblage 14 is of the type described in the above noted application, and reference is made thereto for further details of this configuration. Generally, however, the assemblage includes a lower flexible conductive disk 16 which may have a conductive disk 17 interposed between its inner surface and the bottom surface of wafer 15.

The device then has an upper disk-shaped conductor 18 which again may be connected to the upper surface of wafer 15 through conductive wafer 19.

It is to be noted that members 15, 16, 17, 18 and 19 are not soldered together, but are held together solely by pressure so that the wafer 15 will be free to expand and contract radially independent of the temperature coefficient characteristics of the materials adjacent thereto.

The outer peripheries of disks 16 and 18 are then connected together by the ceramic cylinder 20 which forms a hermetically sealed internal volume. Thus, the entire assemblage 14 is a subassembly which is indepently handled in manufacture.

This subassembly 14 is then placed atop disk 13, and the upper conductive stud 30, having an outwardly flared head 31, is placed thereon. Conductive flat washer 32 is then placed atop head 31, followed by spring washers 33, 34 and 35. Different numbers of spring washers could be used in the assemblage depending upon their design and the forces which are required in the final compression bonding. Thereafter, the flat washer 36 is placed atop the last spring washer 35 and an insulation sleeve or cap 37 is placed over the washer assembly.

A conductive tube 40, which may have been prewelded to stud 10, receives the cap 37, and after the assemblage of the cap 37 a conductive washer 41 is placed atop cap 37, and the cap is depressed with sufficient force to obtain the desired pressure connection between the wafer 15 and conductive members 17 and 19. The washer 41 is then welded in place to the tube 40, and the assembly of the device is completed.

Note that there is no necessity for providing an hermetic seal between cap 37 and stud 30, since the wafer 15 is already hermetically sealed in its subassembly 14.

Although this invention has been described with respect to its preferred embodiments, it should be understood that many variations and modifications will now be obvious to those skilled in the art, and it is preferred, therefore, that the scope of the invention be limited not by the specific disclosure herein, but only by the appended claims.

The embodiments of the invention in which an exclusive privilege or property is claimed are defined as follows:

1. A compression bonded semiconductor device comprising a support base of conductive material; an hermetically sealed subassemblage of a semiconductor wafer supported between a pair of spaced, insulated, flexible, conductive disks and in surface-to-surface contact with the interior opposing surfaces of said flexible conductive disks, a conductive stud having a lower enlarged head portion, a plurality of spring washers, an insulation cap, and a conductive outer tube having an upper and lower end; one of said pair of conductive disks adjacent and in surface-to-surface contact with said support base; the other of said pair of conductive disks receiving the end surface of said lower enlarged head portion of said stud; said lower end of said conductive outer tube mechanically connected to said base and coaxially surrounding said subassembly and said stud; said spring washers stacked upon one another on said stud and biasing at one end of said stack on said enlarged head portion of said stud; said insulation cap extending across the top of said stack and pressing said stack together against said enlarged head portion of said stud, thereby to apply pressure between said wafer and said conductive disks of said subassembly; said upper end of said tube connected to said insulation cap and holding said insulation cap in its pressure applying position.

2. The device as set forth in claim 1 wherein said upper end of said tube extends beyond the upper surface of said insulation cap; said stud extending through said insulation cap to form an output lead for said wafer.

3. The device as set forth in claim 2 which further includes a washer means welded to the interior of said upper end of said tube and extending across a radial portion of said washer to connect said insulation cap to said tube.

References Cited

UNITED STATES PATENTS

| | | | |
|---|---|---|---|
| 3,170,098 | 2/1965 | Marino | 317—234 |
| 3,280,383 | 10/1966 | Emeis | 317—234 |
| 3,293,508 | 12/1966 | Boyer | 317—234 |
| 3,313,987 | 4/1967 | Boyer | 317—234 |

JAMES D. KALLAM, *Primary Examiner.*